(12) United States Patent  
Hong et al.

(10) Patent No.: US 8,907,826 B2  
(45) Date of Patent: Dec. 9, 2014

(54) METHOD FOR ESTIMATING CAPACITANCE WEIGHT ERRORS AND SUCCESSIVE APPROXIMATION ANALOG TO DIGITAL CONVERTER USING THE SAME

(71) Applicant: National Chiao Tung University, Hsinchu (TW)

(72) Inventors: Hao-Chiao Hong, Hsinchu (TW); Tsung-Yin Hsieh, Tainan (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 14/033,773

(22) Filed: Sep. 23, 2013

(65) Prior Publication Data

US 2014/0097975 A1     Apr. 10, 2014

(30) Foreign Application Priority Data

Oct. 5, 2012    (TW) .............................. 101136974 A (51) Int. Cl.
*H03M 1/06* (2006.01)
*H03M 1/12* (2006.01)
*H03M 1/46* (2006.01)
*H03M 1/10* (2006.01)

(52) U.S. Cl.
CPC ............ *H03M 1/1071* (2013.01); *H03M 1/466* (2013.01); *H03M 1/1038* (2013.01); *H03M 1/12* (2013.01)

USPC ............................ 341/118; 341/155; 341/172

(58) Field of Classification Search
CPC .......................................................... H03M 1/12
USPC .................................... 341/155, 172, 120, 118
See application file for complete search history.

(56) References Cited

U.S. PATENT DOCUMENTS

| | | | | |
|---|---|---|---|---|
| 7,015,841 B2* | 3/2006 | Yoshida et al. | ................ | 341/120 |
| 7,812,757 B1* | 10/2010 | Wong et al. | .................... | 341/172 |
| 7,834,796 B2* | 11/2010 | Xu et al. | ........................ | 341/172 |
| 7,961,132 B1* | 6/2011 | Perry et al. | .................... | 341/172 |
| 2005/0200510 A1* | 9/2005 | Yoshida et al. | ................ | 341/155 |
| 2009/0167587 A1* | 7/2009 | Xu et al. | ........................ | 341/172 |

* cited by examiner

*Primary Examiner* — Jean B Jeanglaude
(74) *Attorney, Agent, or Firm* — Muncy, Geissler, Olds & Lowe, P.C.

(57) ABSTRACT

A successive approximation (SA) analog-to-digital converter (ADC) capable of estimating its own capacitance weight errors includes a comparator, a capacitor set, a switch set and a controller. The capacitor set includes a primary capacitor array including a plurality of binary-weighted capacitors, and a secondary capacitor array including a plurality of binary-weighted capacitors with known capacitance weights. The controller controls the switch set and repeats the steps of pre-charging the primary capacitor array, redistributing electric charges to the primary capacitor array and the secondary capacitor array, and performing a successive approximation binary searching on the primary capacitor array and the secondary capacitor array to calculate the capacitance weight error of each capacitor in the primary capacitor array. The calculated capacitance weight errors are used for calibrating the output of the successive approximation ADC.

10 Claims, 10 Drawing Sheets

METHOD FOR ESTIMATING CAPACITANCE WEIGHT ERRORS AND SUCCESSIVE APPROXIMATION ANALOG TO DIGITAL CONVERTER USING THE SAME

CROSS-REFERENCE TO RELATED APPLICATIONS

This non-provisional application claims priority under 35 U.S.C. §119(a) on Patent Application No(s). 101136974 filed in Taiwan, R.O.C. on Oct. 5, 2012, the entire contents of which are hereby incorporated by reference.

BACKGROUND

1. Technical Field

The disclosure relates to the estimation of capacitance weight errors, more particularly to a full-digital capacitance weight error estimation method for estimating capacitance weight errors of a digital to analog converter (DAC) in a successive approximation analog to digital converter (ADC), and the successive approximation ADC using the same.

2. Related Art

The ADC is widely used in communication equipments, measurement instruments, and other various electrical devices. Generally, the ADCs may be sorted as flash ADCs, pipelined ADCs, and successive approximation ADCs, etc. Because the successive approximation ADC may have low power consumption, it is widely used in all kinds of applications.

The accuracy of the switched-capacitor type successive approximation ADC is mainly influenced by the capacitance weight errors. The smaller the capacitance weight errors are, the higher the accuracy of the successive approximation ADC is. However, in the manufacturing processes of the integrated circuits, the capacitance weight errors are unavoidable because of manufacturing process offsets. Therefore, it is the key point for the integrated circuit design to calibrate the capacitance weight errors caused by the manufacturing process offsets, so as to increase the accuracy of the successive approximation ADC.

A conventional technique to calibrate the capacitance weight error is using precision instruments for measuring the actual capacitance value, then using the focused ion beam (FIB) manner for connecting with capacitors in parallel to increase the capacitance value thereof, or using the laser trimming manner for eliminating parallel capacitors to reduce the capacitance value thereof, until the capacitance value thereof matches the expected value, which means the calibration of the capacitance value is done. For either the laser trimming manner or the FIB manner, it is necessary to use extra manpower and equipment resources for calibrating the chipped integrated circuits. This causes extra expenses and enormous time may be required, which increase the manufacturing costs.

Another conventional technique uses a resistor type DAC for generating an analog calibration voltage. After the analog calibration voltage supplies to a terminal of the calibrated capacitor, by changing the digital input code of the DAC, the voltage outputted by another terminal of the calibrated capacitor may be similar to the output voltage of the ideal capacitor without the calibration voltage. Afterward, the digital input code corresponding to the calibration voltage is stored. When the calibrated capacitor needs to be used, the digital input code is converted into the corresponding analog calibration voltage, for compensating the capacitor.

However, because the actual implemented circuits can only generate positive voltages, thus the above resistor type calibration manner is only suitable for the actual capacitance value smaller than the ideal capacitance value. That is, the above manner can only perform the one-sign calibration of the capacitance weight errors. In addition, the above manner needs an extra resistor type DAC. Thus, extra hardware is required, and the errors generated by the resistor type DAC may also influence the accuracy after the calibration.

SUMMARY

The disclosure relates to a method for estimating capacitance weight errors of the DAC in a successive approximation ADC including a comparator, a capacitor set and a switch set. The capacitor set includes a primary capacitor array and a secondary capacitor array. The primary capacitor array includes an auxiliary capacitor and a plurality of first capacitors. The secondary capacitor array includes a low-weighted capacitor array including a plurality of second capacitors which respectively have known capacitance weights. The method includes the following steps.

(A) At least one capacitor in the primary capacitor array is pre-charged by a first reference voltage. (B) Electric charges are redistributed to all of the first capacitors and the auxiliary capacitor in the primary capacitor array and to the second capacitors in the secondary capacitor array.

(C) The second capacitors in the secondary capacitor array are controlled according to bit-cycling signals generated by an output of the comparator, and a voltage at first terminals of the first capacitors in the primary capacitor array successively approximates to a first reference voltage, so as to respectively acquire a digital estimation value of the capacitance weight, and to calculate a capacitance weight error estimation value of corresponding one of the first capacitors and the auxiliary capacitor according to the acquired digital estimation value of capacitance weight and the known capacitance weights. (D) The capacitance weight error estimation values of all the first capacitors and the auxiliary capacitor in the primary capacitor array are determined whether to be calculated or not, and if the capacitance weight error estimation values of all the first capacitors and the auxiliary capacitor in the primary capacitor array are not calculated, the steps (A), (B) and (C) are repeated until the capacitance weight error estimation values of all the first capacitors and auxiliary capacitor in the primary capacitor array are calculated.

The disclosure also relates to a successive approximation ADC including a comparator, a capacitor set, a switch set and a controller. The comparator has a first input terminal, a second input terminal and an output terminal. The first input terminal of the comparator is for being supplied with the first reference voltage.

The capacitor set includes a primary capacitor array and a secondary capacitor array. The primary array includes a plurality of first capacitors and an auxiliary capacitor. The capacitance weight of the smallest capacitor of the first capacitors is 1, and the capacitance weight of the auxiliary capacitor is smaller than 1. Each of the first capacitors and the auxiliary capacitor has a first terminal and a second terminal. The secondary capacitor array includes a plurality of second capacitors, and the capacitance weights of the second capacitors are binary-weighted. Each second capacitor has a first terminal and a second terminal.

The first terminal of each first capacitor in the primary capacitor array is electrically connected to the second input terminal of the comparator. The first terminal of the auxiliary capacitor is electrically connected to the second input terminal of the comparator. The first terminal of each second capacitor in the secondary capacitor array is electrically connected to the second input terminal of the comparator. The second terminals of the first capacitors, the auxiliary capacitor and the second capacitors are electrically connected to the switch set.

The secondary capacitor array further includes an attenuation capacitor. The second capacitors are connected to the second input terminal of the comparator through the attenuation capacitor. The capacitance weight of the attenuation capacitor is 1. The attenuation capacitor has a first terminal and a second terminal. The first terminal of each second capacitor is connected to the second terminal of the attenuation capacitor, and the first terminal of the attenuation capacitor is connected to the second input terminal of the comparator.

The switch set includes a plurality of switches which are connected with the second terminals of the first capacitors and the auxiliary capacitor in the primary capacitor array, and the second terminals of the second capacitors in the secondary capacitor array one to one. The switches respectively control the second terminals of the first capacitors, the auxiliary capacitor, and the second capacitors to be supplied with the first reference voltage or a second reference voltage. The controller is used for controlling the switch set to perform the following steps.

(A) At least one capacitor in the primary capacitor array is pre-charged by the first reference voltage. (B) Electric charges are redistributed to all of the first capacitors and the auxiliary capacitor in the primary capacitor array and to the second capacitors in the secondary capacitor array, by using the charged capacitor. (C) The second capacitors in the secondary capacitor array are controlled according to bit-cycling signals generated by an output of the output terminal of the comparator, to make a voltage at first terminals of the first capacitors and the auxiliary capacitor in the primary capacitor array successively approximate to the first reference voltage, to respectively acquire a digital estimation value of the capacitance weight, and to calculate a capacitance weight error estimation value of corresponding one of the first capacitors and the auxiliary capacitor according to the acquired digital estimation value of the capacitance weight. (D) The steps (A), (B) and (C) are repeated until the capacitance weight error estimation values of all the first capacitors and the auxiliary capacitor in the primary capacitor array are calculated.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

The following embodiments explain the detail features, advantages, and objectives of the disclosure and the descriptions thereof are enough for one skilled in the art to understand and implement the technical contents of the disclosure. Moreover, the embodiments described below use the same symbol for representing the same or similar components.

Figure 1:
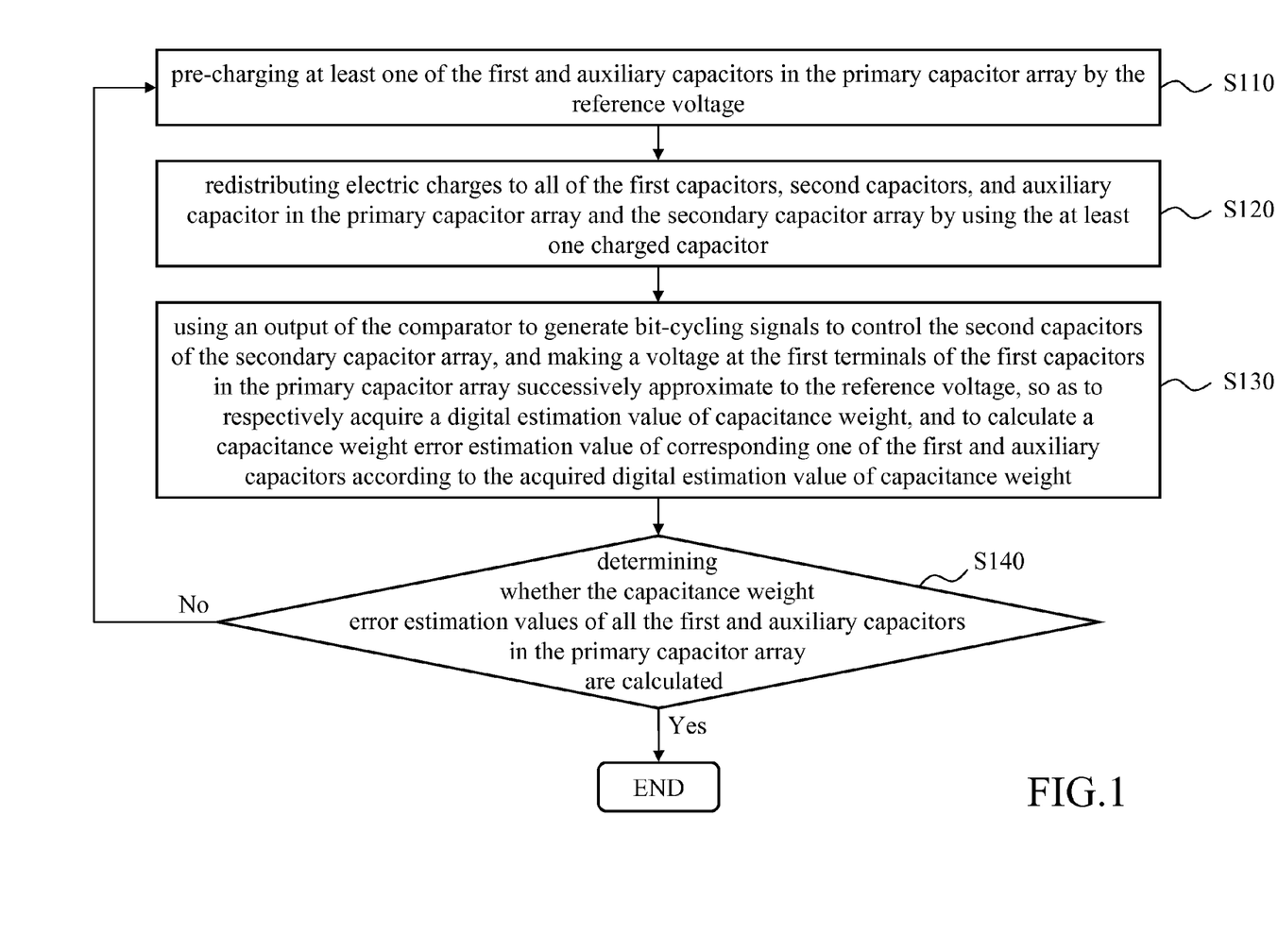
FIG. 1 is a flow chart of a method for estimating capacitance weight errors of a DAC in a successive approximation ADC.

FIG. 1 illustrates a flow chart of a method for estimating a capacitance weight error in a DAC of a successive approximation ADC. The successive approximation ADC in this embodiment includes a comparator, a capacitor set and a switch set. The capacitor set includes a primary capacitor array and a secondary capacitor array. The primary capacitor array includes a plurality of first capacitors and an auxiliary capacitor. The secondary capacitor array includes a low-weighted capacitor array having a plurality of second capacitors with known capacitance weights. In step S110, at least one of the first capacitors and the auxiliary capacitor in the primary capacitor array is pre-charged with a reference voltage. In step S120, the at least one charged capacitor redistributes the electric charges to the first capacitors and the auxiliary capacitor of the primary capacitor array and to the second capacitors of the secondary capacitor array.

In step S130, an output of the comparator is used to generate bit-cycling signals for controlling the second capacitors in the secondary capacitor array, and the voltage at the first terminals of the first capacitors in the primary capacitor array is successively approximated to the reference voltage, so as to respectively acquire a digital estimation value of the capacitance weight, and to calculate a capacitance weight error estimation value of corresponding one of the first and auxiliary capacitors according to the acquired digital estimation value of the capacitance weight. In step S140, it checks whether the capacitance weight error estimation values of all the first capacitors and the auxiliary capacitor in the primary capacitor array are calculated or not. If the capacitance weight error estimation values of all the first and auxiliary capacitors in the primary capacitor array are not calculated, the steps S110, S120 and S130 are repeated until the capacitance weight error estimation values of all the first and auxiliary capacitors in the primary capacitor array are calculated.

The above descriptions briefly explain how to estimate the capacitance weight error in the DAC of the successive approximation ADC. The following descriptions have further explanations along with the circuit structures of the successive approximation ADC.

Figure 2A:
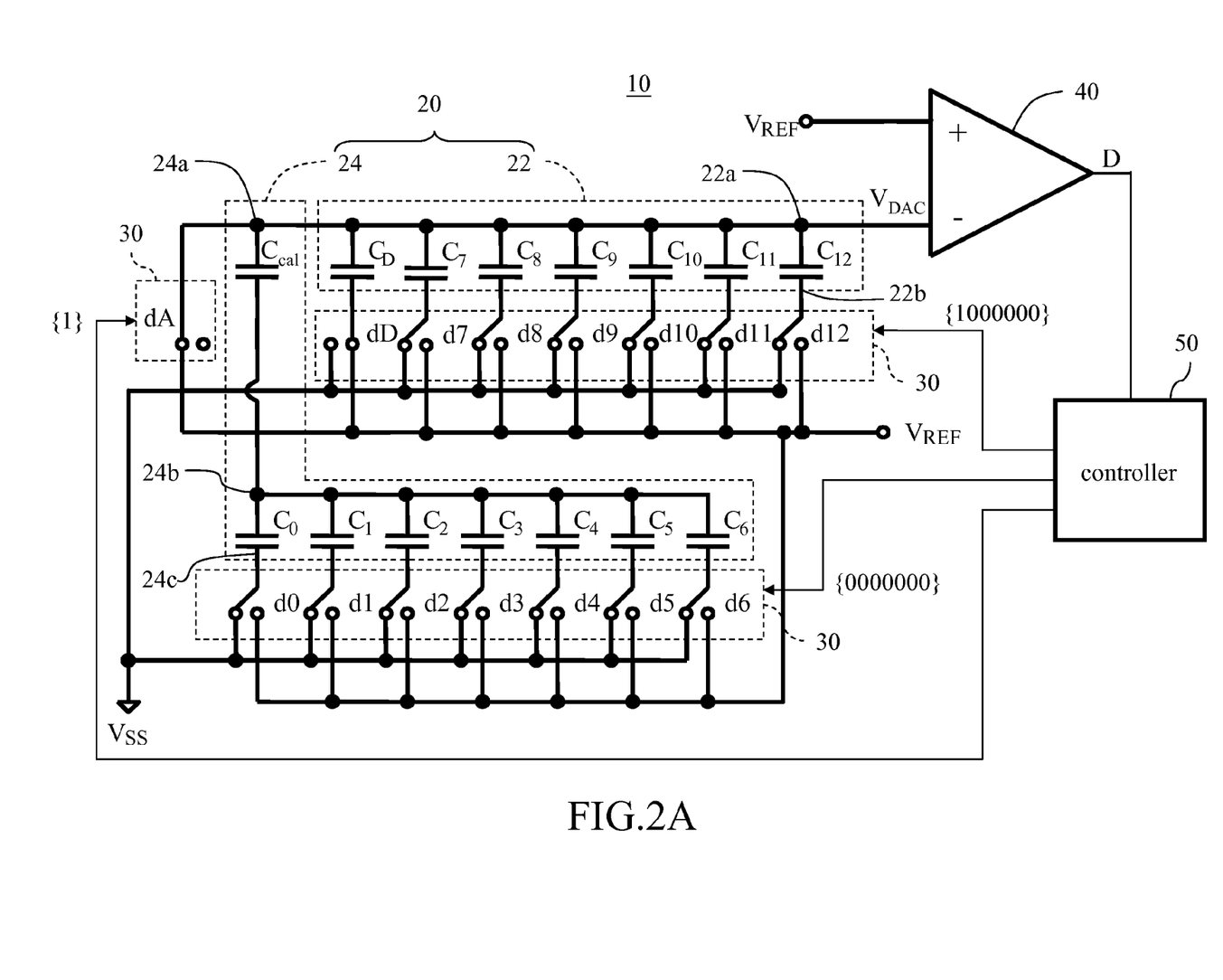
FIGS. 2A to 2C are schematic diagrams of a digital estimation manner of a capacitance weight of an auxiliary capacitor.

For making the embodiment clear, the following symbols are defined in advance, as shown in FIG. 2A. The symbols $c_6$ to $c_0$ are the capacitance values of the capacitors $C_6$ to $C_0$, the symbols $c_{12}$ to $c_7$ are the capacitance values of the capacitors $C_{12}$ to $C_7$, the symbol $c_D$ is the capacitance value of the capacitor $C_D$, and the symbol $c_{cal}$ is the capacitance value of the capacitor $C_{cal}$. The ratio of the capacitance weights of the capacitors $C_6$ to $C_0$ and $C_{cal}$ is $2^6:2^5:2^4:2^3:2^2:2^1:1:1$.

Nominally, the ratio of the capacitance weights of the capacitors $C_{12}$ to $C_7$ and the auxiliary capacitor $C_D$ is $2^5:2^4:2^3:2^2:2^1:1:<1$. That is, the capacitance weights of the capacitors except the auxiliary capacitor are binary-weighted, and the capacitance weight of the capacitor $C_7$ is the smallest among these capacitors and is larger than the nominal capacitance weight of the auxiliary capacitor $C_D$. However, because errors may be introduced to in the manufacturing process of capacitors, the actual capacitance weight ratios of the mentioned capacitors are not exactly scaled.

Let the absolute capacitance values with errors of the capacitors $C_{12}$ to $C_7$ and the auxiliary capacitor $C_D$ be represented as follows:

$$c_{12} = \overline{c_{12}} + \Delta c_{12};$$

$$c_{11} = \overline{c_{11}} + \Delta c_{11};$$

$$c_{10} = \overline{c_{10}} + \Delta c_{10};$$

$$c_9 = \overline{c_9} + \Delta c_9;$$

$$c_8 = \overline{c_8} + \Delta c_8;$$

$$c_7 = \overline{c_7} + \Delta c_7;$$

$$c_D = \overline{c_D} + \Delta c_D;$$

$$\overline{c_{12}}:\overline{c_{11}}:\overline{c_{10}}:\overline{c_9}:\overline{c_8}:\overline{c_7}:\overline{c_D} := 2^5:2^4:2^3:2^2:2^1:1:\beta, \beta<1.$$

The symbols $\overline{c_{12}}$, $\overline{c_{11}}$, $\overline{c_{10}}$, $\overline{c_9}$, $\overline{c_8}$, $\overline{c_7}$, and $\overline{c_D}$ are the nominal and scaled capacitances of the capacitors, and the symbols $\Delta c_{12}$, $\Delta c_{11}$, $\Delta c_{10}$, $\Delta c_9$, $\Delta c_8$, $\Delta c_7$, and $\Delta c_D$ are the absolute capacitance weight errors of the capacitors $C_{12}$ to $C_7$ and the auxiliary capacitor $C_D$.

Figure 2B:
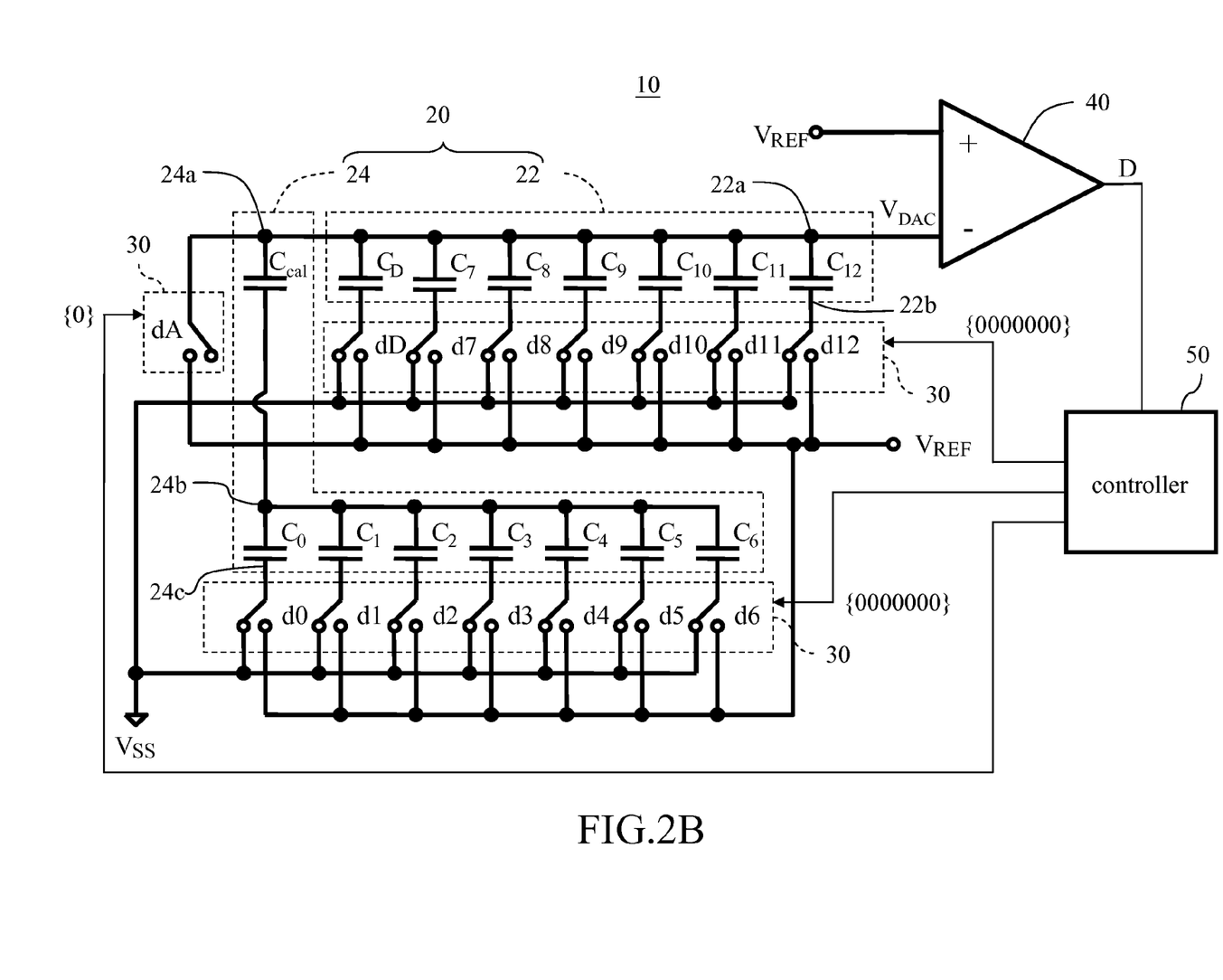
Figure 2C:
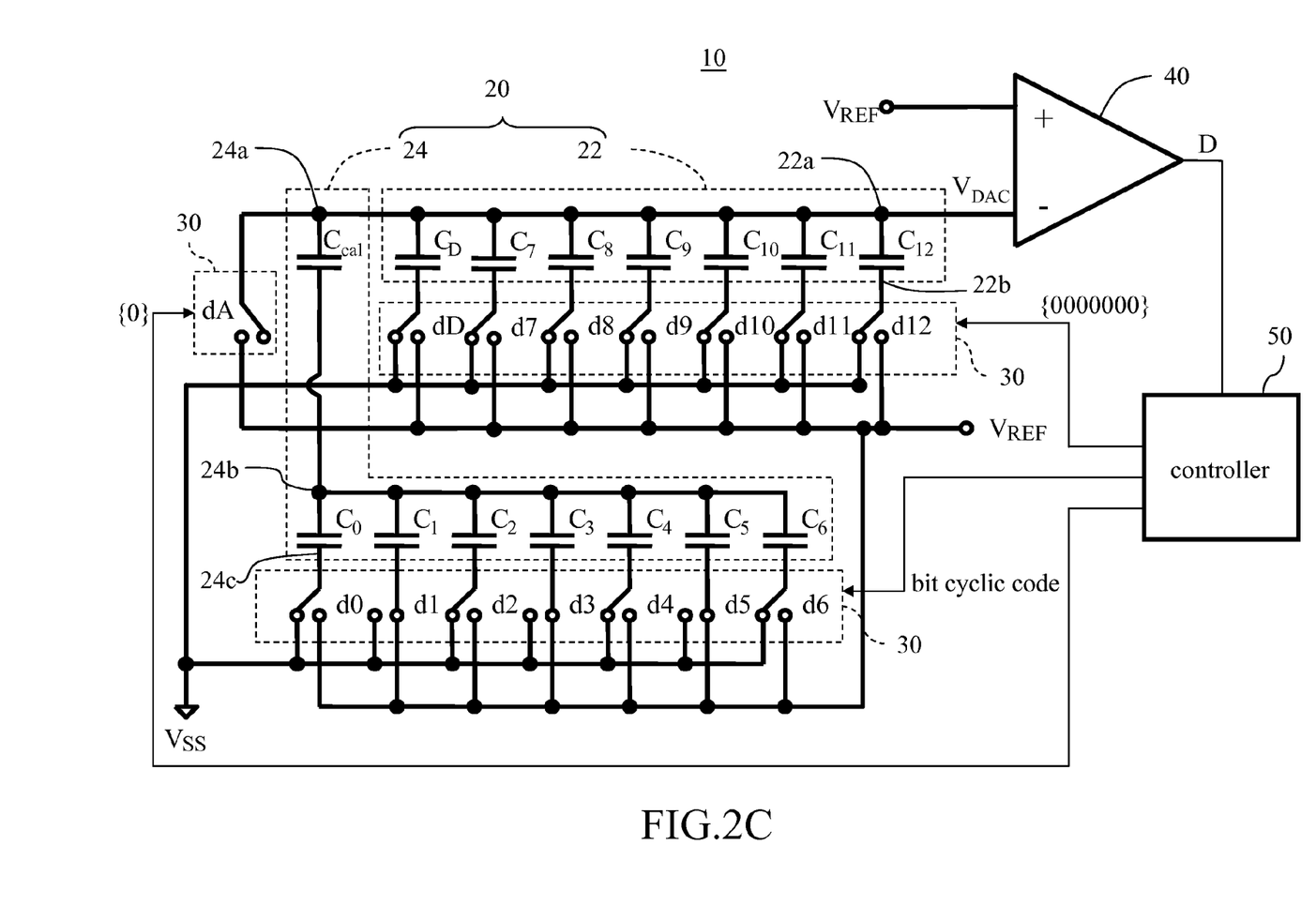

FIGS. 2A to 2C illustrate schematic diagrams of the digital estimation manner of the capacitance weight of the auxiliary capacitor. The successive approximation ADC 10 includes a capacitor set 20, a switch set 30, a comparator 40 and a controller 50. The comparator 40 has a first input terminal, a second input terminal and an output terminal. The first input terminal (such as the non-inverting input terminal) of the comparator 40 is supplied with the reference voltage $V_{REF}$.

The capacitor set includes the primary capacitor array 22 and the secondary capacitor array 24. The primary capacitor array 22 includes the capacitors $C_{12}$ to $C_7$ and an auxiliary capacitor $C_D$. Each of the capacitors $C_{12}$ to $C_7$ and the auxiliary capacitor $C_D$ has a first terminal and a second terminal. The secondary capacitor array 24 includes the attenuation capacitor $C_{cal}$ and the capacitors $C_6$ to $C_0$. Each of the capacitors $C_0$ to $C_6$ and the attenuation capacitor $C_{cal}$ has a first terminal and a second terminal.

The first terminals (such as the terminal 22a shown in the figures) of the capacitors $C_{12}$ to $C_7$ and the auxiliary capacitor $C_D$ are connected to the second input terminal (such as the inverting input terminal) of the comparator 40. The first terminal (such as the terminal 24a shown in the figures) of the attenuation capacitor $C_{cal}$ is connected to the second input terminal of the comparator 40, and to the first terminals (the terminals 22a shown in the figures) of the capacitors $C_{12}$ to $C_7$ in the primary capacitor array 22. The second terminal (such as the terminal 24b shown in the figures) of the attenuation capacitor $C_{cal}$ is connected to the first terminals of the capacitors $C_6$ to $C_0$.

The switch set 30 has a plurality of switches including the switches d12 to d0, dD, and dA. The switches d12 to d0 and dD are respectively connected to the capacitors $C_{12}$ to $C_0$ and the auxiliary capacitor $C_D$ one to one. That is, each switch only connects to one capacitor. Each switch has an input terminal, a first output terminal and a second output terminal. The input terminals of the switches d12 to d7 and dD are respectively connected to the second terminals (such as terminals 22b) of the capacitors $C_{12}$ to $C_7$ and the auxiliary capacitor $C_D$. The input terminals of the switches d6 to d0 are respectively connected to the second terminals (such as terminals 24c shown in the figures) of the capacitors $C_6$ to $C_0$.

The first output terminals of the switches d12 to d0 and dD are supplied with the reference voltage $V_{REF}$. The second output terminals of the switches d12 to d0 and dD are supplied with the reference voltage $V_{SS}$ (such as a ground voltage or a work voltage). The control signals outputted by the controller 50 control the above switches, so that the input terminals of the switches are selectively connected to the first output terminals or the second output terminals.

For example, when the control signal is "0", the input terminal of the switch is connected to the second output terminal thereof, which is supplied with the reference voltage $V_{SS}$, and when the control signal is "1", the input terminal of the switch is connected to the first output terminal which is supplied with the reference voltage $V_{REF}$. However, the mentioned embodiments show only one kind of control manner, and the disclosure is not limited thereby. The switch dA also has an input terminal, a first output terminal and a second output terminal. The input terminal of the switch dA is connected to the first terminals (the terminals 22a) of the capacitors $C_{12}$ to $C_7$ and the auxiliary capacitor $C_D$ in the primary capacitor array 22 and the first terminal (the terminal 24a) of the attenuation capacitor $C_{cal}$ in the secondary capacitor array 24. The first output terminal of the switch dA is supplied with the reference voltage $V_{REF}$, and the second output terminal of the switch dA is floating.

The controller 50 is coupled to the output terminal of the comparator 40. The controller 50 sends control signals for controlling the operation of each switch in the switch set 30. The control steps executed by the controller 50 are described as follows.

In FIG. 2A, the controller 50 transmits a signal set of {1000000} to the switches dD and d7 to d12, transmits a signal set of {0000000} to the switches d0 to d6, and transmits a signal of {1} to the switch dA. Herein, because the input terminal of the switch dA is connected to the first output terminal which is supplied with the reference voltage $V_{REF}$, the first terminals (the terminals 22a shown in the figures) of the capacitors $C_{12}$ to $C_7$ and the auxiliary capacitor $C_D$ in the primary capacitor array 22, and the first terminal (the terminal 24a shown in the figures) of the attenuation capacitor $C_{cal}$ are supplied with the reference voltage $V_{REF}$.

The input terminal of the switch dD is connected to the first output terminal which is supplied with the reference voltage $V_{REF}$, so that the two terminals of the auxiliary capacitor $C_D$ are supplied with the reference voltage $V_{REF}$. The switches d12 to d0 respectively corresponding to the other capacitors $C_{12}$ to $C_0$ are supplied with the reference voltage $V_{SS}$.

In this embodiment, the auxiliary capacitor $C_D$ is the capacitor under test (CUT). That is, in this step, the reference voltage $V_{REF}$ charges all of the capacitors including the capacitors $C_{12}$ to $C_0$ and the attenuation capacitor $C_{cal}$, except the auxiliary capacitor $C_D$.

Subsequently, in FIG. 2B, the controller 50 transmits a signal set of {0000000} to the switches dD and d7 to d12, transmits a signal set of {0000000} to the switches d0 to d6, and transmits a signal of {0} to the switch dA. Because the input terminal of the switch dA is connected to the second output terminal (floating), the first terminals (the terminals 22a) of the capacitors $C_{12}$ to $C_7$ and the auxiliary capacitor $C_D$ in the primary capacitor array 22 are not supplied with the reference voltage $V_{REF}$. Herein, the charging electric charges acquired in the previous step are redistributed to the primary capacitor array 22 and the secondary capacitor array 24.

Next, in FIG. 2C, the controller 50 transmits a signal set of {0000000} to the switches dD and d7 to d12, serially transmits a plurality of sets of bit-cycling codes to the switches d0 to d6, and transmits a signal of {0} to the switch dA. Herein, the controller 50 selects the bit-cycling codes by using a binary search manner according to the output D at the output terminal of the comparator 40, so that the output voltage $V_{DAC}$ at the first terminals (the terminals 22a) of the capacitors $C_{12}$ to $C_7$ and the auxiliary capacitor $C_D$ in the primary capacitor array 22 is successively approximated to the reference voltage $V_{REF}$.

For example, the controller 50 may firstly transmit a signal set of {0000001} to the switches d0 to d6. If the reference voltage $V_{REF}$ is larger than the output voltage $V_{DAC}$, the bit-cycling signal corresponding to switch d6 is set as "1". If the reference voltage $V_{REF}$ is smaller than the output voltage $V_{DAC}$, the bit-cycling signal corresponding to switch d6 is set as "0". When the bit-cycling signal corresponding to switch d6 is set as "0", the controller 50 transmits a signal set of {0000010} to the switches d0 to d6. Similarly, if the reference voltage $V_{REF}$ is larger than the output voltage $V_{DAC}$, the bit-cycling signal corresponding to switch d5 is set as "1". If the reference voltage $V_{REF}$ is smaller than the output voltage $V_{DAC}$, the bit-cycling signal corresponding to switch d5 is set as "0". Successively, each bit of the bit-cycling signals is set by a similar manner, and the digital estimation value of the capacitance weight of corresponding capacitor is acquired.

The aforementioned operations are analyzed as follows.

In the step of pre-charging as shown in FIG. 2A, the electric charges $Q_T$ at the first terminals (the terminals 22a) of the capacitors $C_{12}$ to $C_7$ and the auxiliary capacitor $C_D$ in the primary capacitor array 22 satisfies the following equations:

$$Q_T = (c_{Mtotal} - c_{Mprc}) \times V_{REF} + c_{cal} \times (V_{REF} - V_S); \text{ and}$$

$$c_{Mtotal} = c_{12} + c_{11} + c_{10} + \ldots + c_7 + c_D;$$

where the $V_S$ is the voltage of the first terminals (the terminals 24b) of the capacitors $C_6$ to $C_0$ in the secondary capacitor array 24, and $c_{Mprc}$ is the sum of the capacitances of the capacitors supplied with the reference voltage $V_{REF}$ in the pre-charging step.

Take FIG. 2A as an example, the capacitance sum $c_{Mprc}$ is equal to the capacitance $C_D$. The number of electric charges of the second terminals (the terminals 24b) of the capacitors $C_6$ to $C_0$ in the secondary capacitor array 24 satisfies the following equations:

$$Q_{cal} = c_{cal} \times (V_S - V_{REF}) + c_{Stotal} \times V_S; \text{ and}$$

$$c_{Stotal} = c_0 + c_1 + \ldots + c_6.$$

The second step of the digital estimation manner of the capacitance weight of the auxiliary capacitor $C_D$ is the redistribution of the electric charges as shown in FIG. 2B. After redistributing the electric charges, the number of electric charges of the first terminals (the terminals 22a) of the capacitors $C_{12}$ to $C_7$ and the auxiliary capacitor $C_D$ satisfies the following equation:

$$Q_T = (c_{MTotal} - c_{Mset}) \times V_{dac} + c_{Mset}(V_{dac} - V_{REF}) + c_{cal} \times (V_{dac} - V_{cal});$$

where $V_{cal}$ is the voltage of the first terminals (the terminals 24b) of the capacitors $C_6$ to $C_0$ in the secondary capacitor array 24, and $c_{Mset}$ is the sum of the capacitances of the capacitors, which are controlled by the corresponding control signals of "1", of the primary capacitor array 22 supplied with the reference voltage $V_{REF}$ in the step for redistributing the electric charges. In FIG. 2b, $c_{Mset} = 0$.

The following steps conduct bit-cycling to successively approximate the voltage of the second input terminal of the comparator to that of the first input terminal of the comparator (22a). FIG. 2C depicts an example after the successive approximation steps. The number of electric charges of the first terminals (the terminals 22a) of the capacitors $C_{12}$ to $C_7$ and the auxiliary capacitor $C_D$ remains unchanged during these steps. The number of the electric charges of the first terminals (the terminals 24b) of the capacitors $C_6$ to $C_0$ in the secondary capacitor array 24 satisfies the following equation:

$$Q_{cal} = c_{cal} \times (V_{cal} - V_{dac}) + (c_{Stotal} - c_{cyc}) \times V_{cal} + c_{cyc} \times (V_{cal} - V_{REF});$$

where $c_{cyc}$ is the sum of the capacitances of the capacitors of the secondary capacitor array 24 whose second terminals are supplied with the reference voltage $V_{REF}$. According to the electric charge conservation principle, the following two functions are obtained:

$$Q_T = (c_{Mtotal} - c_{Mprc}) \times V_{REF} + c_{cal} \times (V_{REF} - V_S) = \quad (1)$$
$$(c_{MTotal} - c_{Mset}) \times V_{dac} \times c_{Mset} \times (V_{dac} - V_{REF}) +$$
$$c_{cal} \times (V_{dac} - V_{cal});$$

and $$Q_{cal} = c_{cal} \times (V_S - V_{REF}) + c_{Stotal} \times V_S = \quad (2)$$
$$c_{cal} \times (V_{cal} - V_{dac}) + (c_{Stotal} - c_{cyc}) \times V_{cal} + c_{cyc} \times (V_{cal} - V_{REF}).$$

By rearranging the above two functions, the equation (3) is obtained as follows:

$$(c_{Mtotal} - c_{Mprc}) \times V_{REF} + c_{Stotal} \times V_S = (c_{MTotal} - c_{Mset}) \times V_{dac} + \quad (3)$$
$$c_{Mset} \times (V_{dac} - V_{REF}) + c_{Stotal} \times V_{cal} - c_{cyc} \times V_{REF}.$$

Supposing $V_{REF} = V_{dac}$, the equation (3) is simplified to be:

$$(c_{Mset} - c_{Mprc}) \times V_{REF} + c_{cyc} \times V_{REF} = c_{Stotal} \times (V_{cal} - V_s). \quad (4)$$

On the other hand, the equation (1) is rewritten as:

$$V_S - V_{cal} = (c_{Mset} - c_{Mprc}) \times V_{REF}/c_{cal}, \quad (5)$$

By (5) and (4), we have:

$$c_{Mprc} - c_{Mset} = \quad (6)$$
$$\frac{c_{cal}}{(c_{cal} + c_{Stotal})} c_{cyc} = \frac{c_{cal}}{(c_{cal} + c_{Stotal})} dc_x \times c_0 = W_{sub} \times dc_x \times c_0;$$

and $$W_{sub} \equiv \frac{c_{cal}}{(c_{cal} + c_{Stotal})};$$

where $W_{sub}$ is defined as the capacitance weight of the secondary capacitor array, $dc_x$ is the corresponding digital estimation value of $c_x$ where $c_x$ is the capacitance weight of one of the first capacitors $C_{12}$ to $C_7$ and the auxiliary capacitor $C_D$. In this embodiment, the digital estimation value $dc_x$ is in between 0 and 127.

By substituting the conditions of the FIGS. 2A to 2C, $c_{Mprc} = c_D$, $c_{Mset} = 0$, $c_{Stotal} = 127c_0$, and $c_{cyc} = c_1 + c_3 + c_5$, into the function (6), we have:

$$c_D = \frac{1}{128} \times c_{cyc} = \quad (7)$$
$$\frac{1}{128} \times (c_1 + c_3 + c_5) = \frac{1}{128}(1 + 4 + 16) \times c_0 = W_{sub} \times dc_D \times c_0.$$

The symbol $dc_D$ is defined as the digital estimation value of the capacitance weight of the auxiliary capacitor $C_D$. The $dc_D$ is the target digital code acquired in the bit-cycling processes. Accordingly, the digital estimation value of the capacitance weight of the auxiliary capacitor $C_D$ is estimated through the function (7).

To calculate the capacitance weight error $\Delta c_D$ between the actual capacitance $c_D$ and the nominal capacitance $\overline{c_D}$, the function (7) may be substituted into the representation function of capacitance weight error to obtain the equation (8) as follows:

$$dc_D W_{sub} c_0 = \overline{c_D} + \Delta c_D. \quad (8)$$

As set forth above, the foregoing descriptions are only exemplary embodiments, so that the bit-cycling signals used in the binary searching, and the number of capacitors does not limit the disclosure.

After acquiring the digital estimation value of the capacitance weight of the auxiliary capacitor $C_D$, the digital estimation processes of the capacitance weight of the capacitor $C_7$ may successively be executed.

Figure 3A:
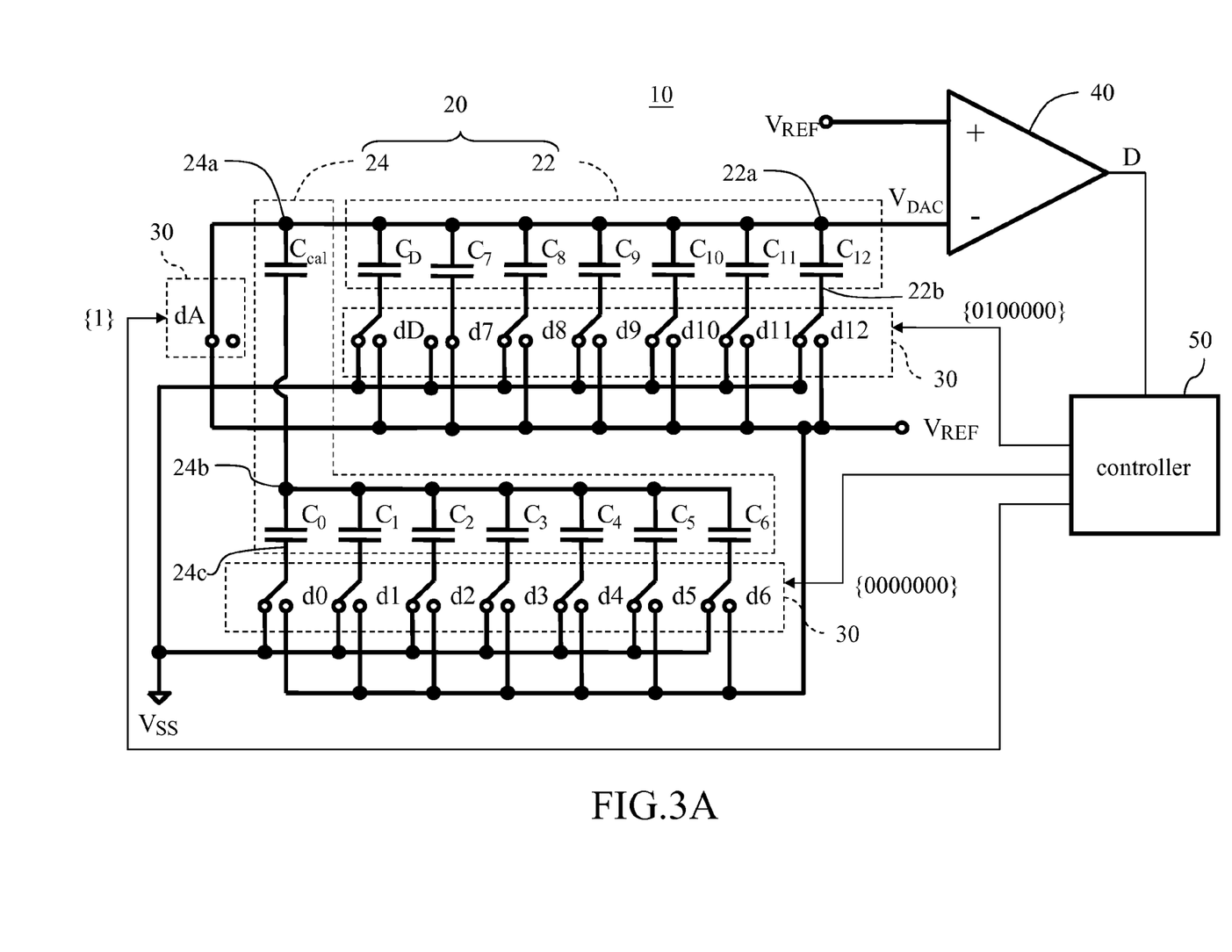
FIGS. 3A to 3C are schematic diagrams of a digital estimation manner of a capacitance weight of a capacitor $C_7$.
Figure 3B:
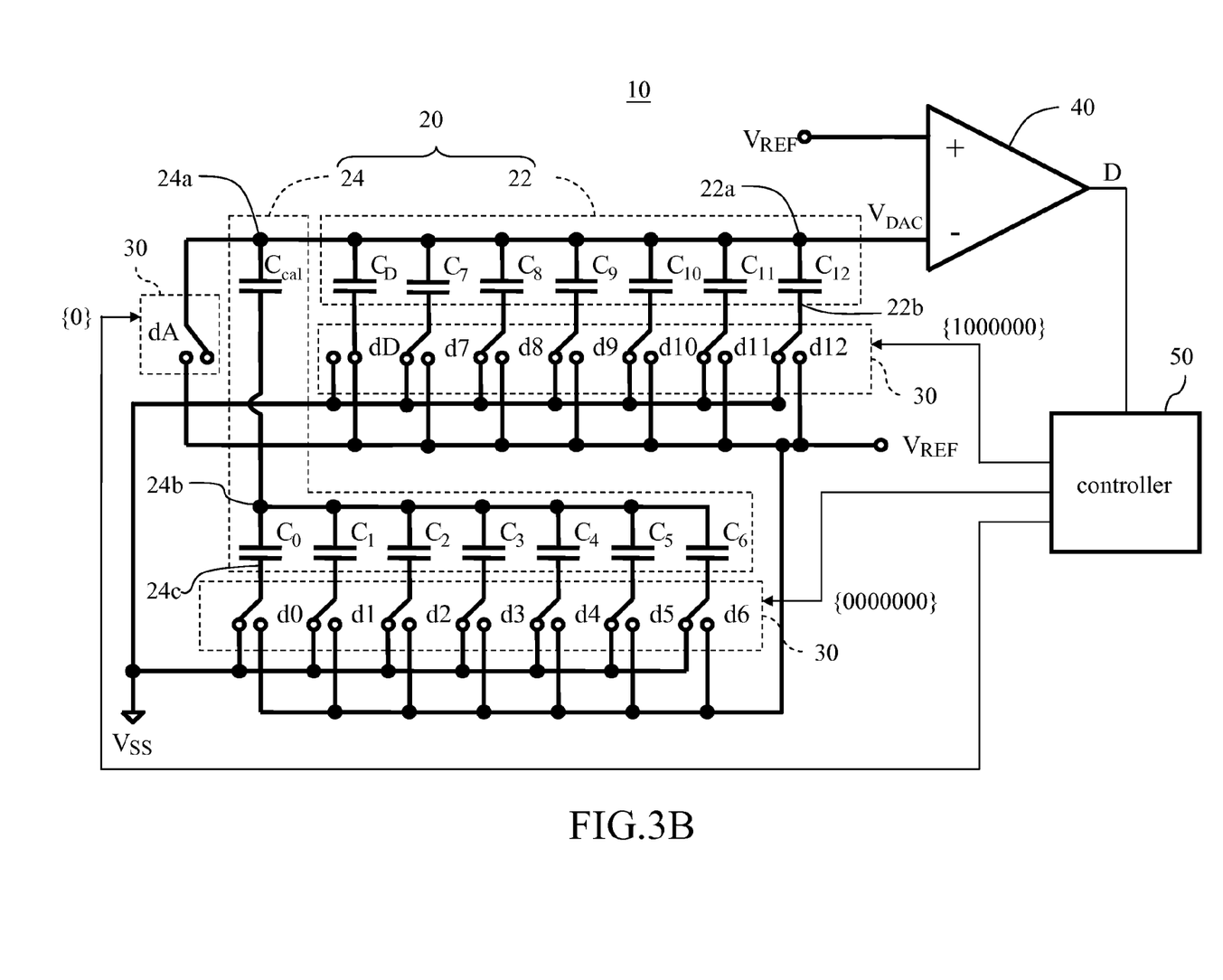
Figure 3C:
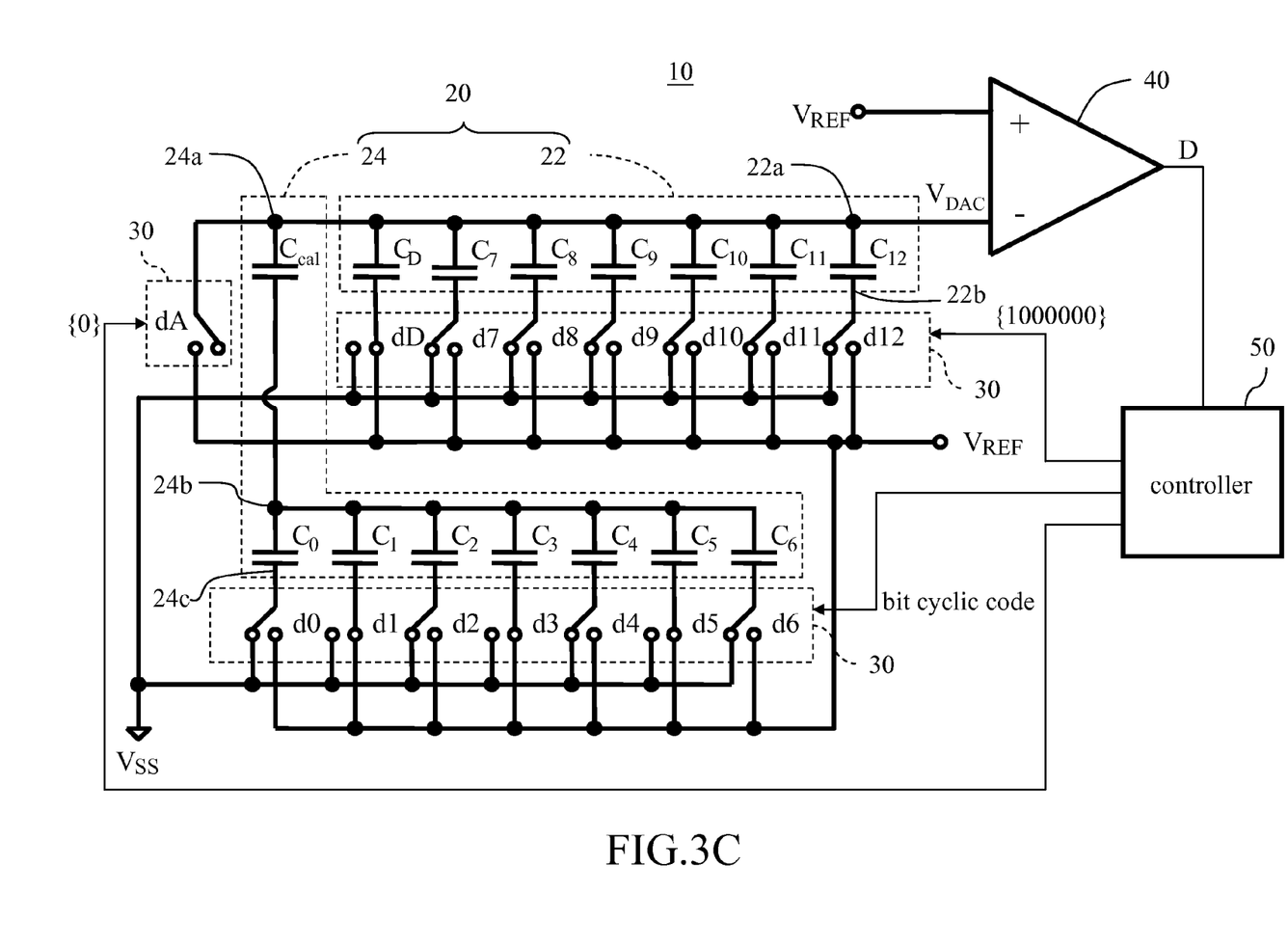

FIGS. 3A to 3C illustrate the schematic diagrams of the digital estimation manner of the capacitance weight of the capacitor $C_7$.

In FIG. 3A, the controller 50 transmits a signal set of {0100000} to the switches dD and d7 to d12, a signal set of {0000000} to the switches d0 to d6, and a signal of {1} to the switch dA. Herein, because the input terminal of the switch dA is connected with the first output terminal which is supplied with the reference voltage $V_{REF}$, the first terminals (the terminals 22a) of the capacitors $C_{12}$ to $C_7$ and the auxiliary capacitor $C_D$ in the primary capacitor array 22 and the first terminal (the terminal 24a) of the attenuation capacitor $C_{cal}$ in the secondary capacitor array 24 are supplied with the reference voltage $V_{REF}$.

The input terminal of the switch d7 connects with the first output terminal which is supplied with the reference voltage $V_{REF}$, so that the two terminals of the capacitor $C_7$ are both supplied with the reference voltage $V_{REF}$. The other capacitors, namely the capacitors $C_{12}$ to $C_0$ and the auxiliary capacitor $C_D$ are supplied with the reference voltage $V_{SS}$. That is, $c_{Mprc} = c_7$.

In this embodiment, the capacitor $C_7$ is a CUT. That is, in this step, the reference voltage $V_{REF}$ is only used for charging the capacitor $C_7$. Thus, $c_{Mprc} = c_7$.

Subsequently, in FIG. 3B, the controller 50 transmits a signal set of {1000000} to the switches dD and d7 to d12, transmits a signal set of {0000000} to the switches d0 to d6, and transmits a signal of {0} to the switch dA. Herein, $c_{Mset} = c_D$.

Because the input terminal of the switch dA is connected to the second output terminal (floating), the first terminals (the terminals 22a) of the capacitors $C_{12}$ to $C_7$ and the auxiliary capacitor $C_D$ in the primary capacitor array 22 are floating. Herein, the charging electric charges acquired in the previous step may be redistributed to the primary capacitor array 22, the secondary capacitor array 24, and the auxiliary capacitor $C_D$.

Next, in FIG. 3C, the controller 50 transmits a signal set of {1000000} to the switches dD and d7 to d12, serially transmits a plurality of signal sets of bit-cycling codes to the switches d0 to d6, and transmits a signal of {0} to the switch dA. Herein, the controller 50 may use the binary searching manner for setting the bit-cycling codes according to the output D of the comparator 40 to control the switch set so that the output voltage $V_{DAC}$ at the first terminals (the terminals 22a) of the capacitors $C_{12}$ to $C_7$ and the auxiliary capacitor $C_D$ in the primary capacitor array 22 successively approximate to the reference voltage $V_{REF}$.

Let the final acquired bit-cycling code after bit-cycling be $dc_7$. By (6) with the new definitions of $c_{Mprc} = c_7$ and $c_{Mset} = c_D$, we have:

$$c_7 - c_D = \frac{1}{128} \times c_{cyc} = dc_7 \times W_{sub} \times c_0. \quad (9)$$

By the above steps, the digital estimation value of the capacitance weight of the capacitor $C_7$ is expressed as:

$$c_7 = (dc_7 + dc_D) \times W_{sub} \times c_0. \quad (10)$$

The capacitance weight error $\Delta c_7$ between the actual capacitance $c_7$ and the theoretical capacitance $\overline{c_7}$ can be calculated according to the function (10) as follows:

$$c_7 = \overline{c_7} + \Delta c_7 = (dc_7 + dc_D) \times W_{sub} \times c_0; \text{ and}$$

$$\Delta c_7 = (dc_7 + dc_D) \times W_{sub} \times c_0 - \overline{c_7}. \quad (11)$$

After acquiring the digital estimation of the capacitance weight of the capacitor $C_7$, the digital estimations of the capacitance weights of the capacitors $C_8$, $C_9$, $C_{10}$, $C_{11}$, and $C_{12}$ are also acquired by using the similar manner.

Specifically, when acquiring the digital estimation of the capacitance weight of the capacitor $C_8$ in the pre-charging step, the controller 50 transmits a signal set of {0010000} to the switches dD and d7 to d12, transmits a signal set of {0000000} to the switches d0 to d6, and transmits a signal of {1} to the switch dA. Herein, $c_{Mprc} = c_8$. In the step of redistributing electric charges, the controller 50 transmits a signal set of {1100000} to the switches dD and d7 to d12, transmits a signal set of {0000000} to the switches d0 to d6, and transmits a signal of {0} to the switch dA. Herein, $c_{Mset} = c_7 + c_D$. In the step of approximating successively, the controller 50 transmits a signal set of {1100000} to the switches dD and d7 to d12, successively transmits a plurality of signal sets of bit-cycling codes to the switches d0 to d6, and transmits a signal of {0} to the switch dA.

By the aforementioned steps, we have:

$$c_8 - (c_7 + c_D) = \frac{1}{128} \times c_{cyc} = dc_8 \times W_{sub} \times c_0; \quad (12)$$

where $dc_8$ is the final bit-cycling code in this step.

Then, the function (12) is substituted into the capacitance weight error representation function, and the actual capacitance value $c_8$ is expressed as:

$$c_8 = \overline{c_8} + \Delta c_8 = (dc_8 + dc_7 + dc_D) \times W_{sub} \times c_0. \quad (13)$$

When acquiring the digital estimation of the capacitance weight of the capacitor $C_9$, the controller 50 in the pre-charging step transmits a signal set of {0001000} to the switches dD and d7 to d12, transmits a signal set of {0000000} to the switches d0 to d6, and transmits a signal of {1} to the switch dA. Herein, $c_{Mprc} = c_9$. In the step of redistributing the electric charges, the controller 50 transmits a signal set of {1110000} to the switches dD and d7 to d12, transmits a signal set of {0000000} to the switches d0 to d6, and transmits a signal of {0} to the switch dA. Herein, $c_{Mset} = c_8 + c_7 + c_D$. In the step of approximating successively, the controller 50 transmits a signal set of {1110000} to the switches dD and d7 to d12, successively transmits a plurality of signal sets of bit-cycling codes to the switches d0 to d6, and transmits a signal of {0} to the switch dA.

By the above steps, the digital estimation value of the capacitance weight of the capacitor $C_9$ is acquired. Let $dc_9$ be the final bit-cycling code in this step, and we have:

$$c_9 = (dc_9 + dc_8 + dc_7 + dc_D) \times W_{sub} \times c_0. \quad (14)$$

By using the similar manner, $c_{10}$, $c_{11}$ and $c_{12}$ are respectively expressed as:

$$c_{10} = (dc_{10} + dc_9 + dc_8 + dc_7 + dc_D) \times W_{sub} \times c_0;$$

$$c_{11} = (dc_{11} + dc_{10} + dc_9 + dc_8 + dc_7 + dc_D) \times W_{sub} \times c_0; \text{ and}$$

$$c_{12} = (dc_{12} + dc_{11} + dc_{10} + dc_9 + dc_8 + dc_7 + dc_D) \times W_{sub} \times c_0. \quad (15)$$

After acquiring the digital estimations of the capacitance weights of all the first capacitors, their capacitance weight errors $\Delta c_D$ and $\Delta c_7$ to $\Delta c_{12}$ are expressed as:

$$\Delta c_D = dc_D \times W_{sub} \times c_0 - \overline{c_D};$$

$$\Delta c_7 = (dc_7 + dc_D) \times W_{sub} \times c_0 - \overline{c_7};$$

$$\Delta c_8 = (dc_8 + dc_7 + dc_D) \times W_{sub} \times c_0 - \overline{c_8};$$

$$\Delta c_9 = (dc_9 + dc_8 + dc_7 + dc_D) \times W_{sub} \times c_0 - \overline{c_9};$$

$$\Delta c_{10} = (dc_{10} + dc_9 + dc_8 + dc_7 + dc_D) \times W_{sub} \times c_0 - \overline{c_{10}};$$

$$\Delta c_{11} = (dc_{11} + dc_{10} + dc_9 + dc_8 + dc_7 + dc_D) \times W_{sub} \times c_0 - \overline{c_{11}};$$

$$\Delta c_{12} = (dc_{12} + dc_{11} + dc_{10} + dc_9 + dc_8 + dc_7 + dc_D) \times W_{sub} \times c_0 - \overline{c_{12}}. \quad (16)$$

In this way, the capacitance weight errors $\Delta c_D$ and $\Delta c_7$ to $\Delta c_{12}$ can be obtained. These capacitance weight errors can be used for calibrating the successive approximation ADC. The successive approximation ADC is described as below.

Figure 4:
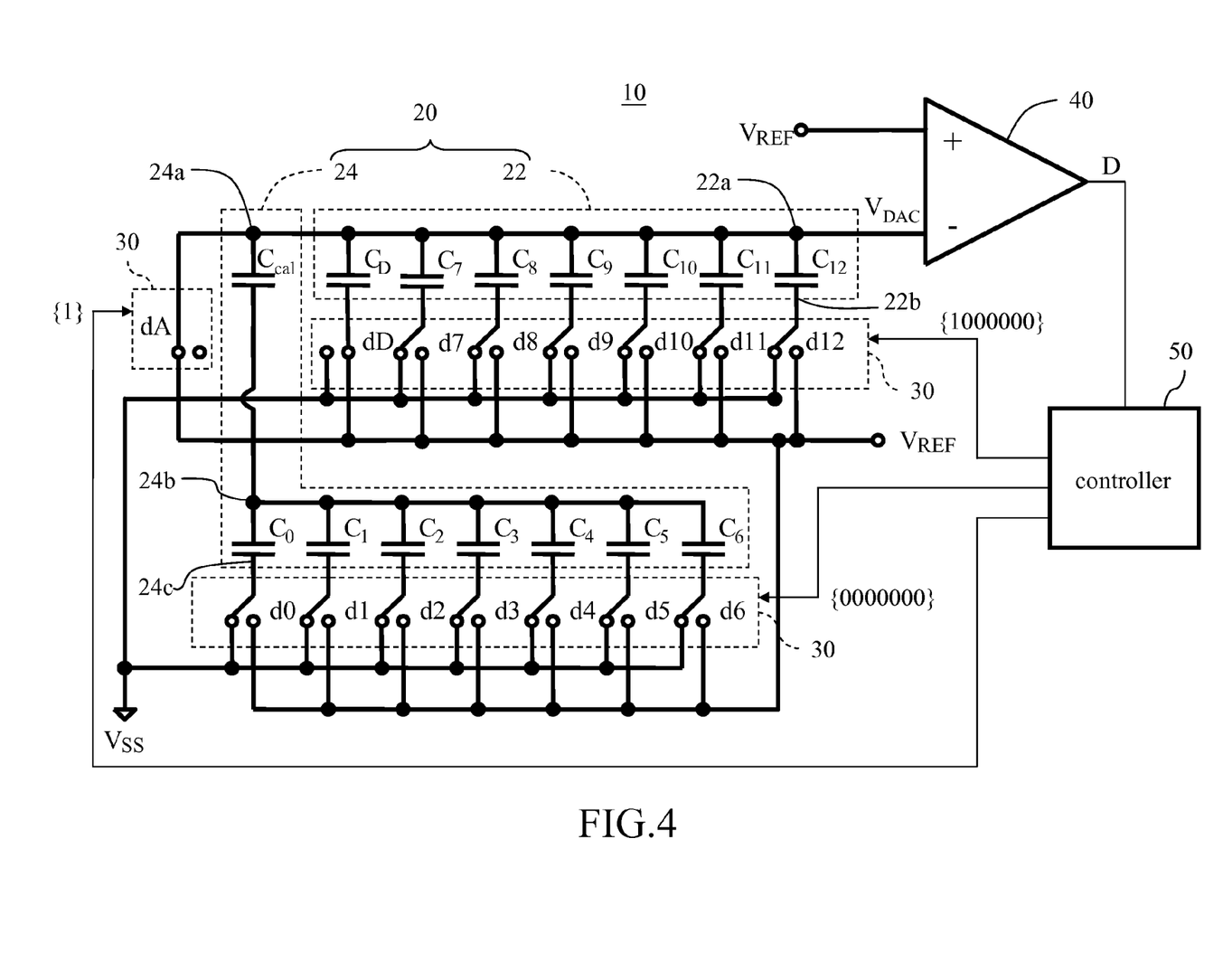
FIG. 4 is a schematic diagram of the calibrating operations of a successive approximation ADC.

FIG. 4 illustrates a schematic diagram of the calibration operations of a successive approximation ADC. The circuit structure in FIG. 4 is the same as the aforementioned circuit structure of the error estimation. That is, the analog to digital conversion and the error estimation may use exactly the same circuit. The analog signals are inputted to the first input terminal (the positive input terminal) of the comparator 40. The second input terminal (the negative input terminal) of the comparator 40 is connected to the first terminals (the terminals 22a) of the capacitors $C_{12}$ to $C_7$ and the auxiliary capacitor $C_D$ in the primary capacitor array 22, and to the first terminal (the terminal 24a) of the attenuation capacitor $C_{cal}$ in the secondary capacitor array 24.

The controller 50 can generate control signals for controlling the switches connected to the capacitors $C_{12}$ to $C_7$ and the auxiliary capacitor $C_D$ in the primary capacitor array 22 according to the binary searching algorithm, and can successively generate the digital-to-analog voltages, for example, $(1/2)V_{REF}$, $d_{12}(1/2)V_{REF} + (1/2^2)V_{REF}$, $d_{12}(1/2)V_{REF} + d_{11}(1/2^2)V_{REF} + (1/2^3)V_{REF}$, $d_{12}(1/2)V_{REF} + d_{11}(1/2^2)V_{REF} + d_{10}(1/2^3)V_{REF} + (1/2^4)V_{REF}$ and so on, wherein $d_{12}$ to $d_7$ respectively represent the bits successively outputted by the comparator 40. These digital-to-analog voltages and the above analog signals are used for generating digital signals which are the results of the analog to digital conversion.

Because the capacitance weight errors of the capacitors $C_7$ to $C_{12}$ in the primary capacitor array 22 cause the deviations of the digital-to-analog voltages required by the binary searching algorithm, the capacitance weight errors $\Delta c_{12}$ to $\Delta c_7$ can be used for controlling the switches in the secondary capacitor array 24 to compensate the deviations, thereby generating more precise analog voltages for increasing the accuracy of the analog to digital conversion.

The disclosure also uses the acquired weight information to calibrate the digital output of the successive approximation ADC in a digital manner. The relation between the output and input of the successive approximation ADC is expresses as:

$$\frac{V_{in}}{V_{REF}} = \left( d_{12} \frac{c_{12}}{C_T} + d_{11} \frac{c_{11}}{C_T} + \ldots + d_2 \frac{c_2}{C_T} + d_1 \frac{c_1}{C_T} \right) + q_e \quad (17)$$

$$= (d_{12} 2^{-1} + d_{11} 2^{-2} + \ldots + d_2 2^{-11} + d_1 2^{-12}) +$$

$$\left( d_{12} \frac{\Delta c_{12}}{C_T} + d_{11} \frac{\Delta c_{11}}{C_T} + \ldots + d_7 \frac{\Delta c_7}{C_T} \right) + q_e;$$

where $q_e$ is the quantified error caused in the analog to digital conversion, and $C_T$ is the equivalent total capacitance value at the second input terminal of the comparator.

By the equation (16), the digital representation codes of the capacitance weight errors of all the first capacitors can be acquired. From the equation (17), the disclosure can obtain the accurate digital output result issued by digitally eliminating the quantified errors of the capacitance weight errors.

In this embodiment, the capacitance weights of the capacitance values of the capacitors $C_{12}$ to $C_7$ and the auxiliary capacitor $C_D$ are nominally $2^5$, $2^4$, $2^3$, $2^2$, $2^1$, 1 and <1 respectively, and the capacitance weights of the capacitance values of the capacitors $C_6$ to $C_0$ and $C_{cal}$ are $2^6$, $2^5$, $2^4$, $2^3$, $2^2$, $2^1$, 1 and 1 respectively.

Figure 5:
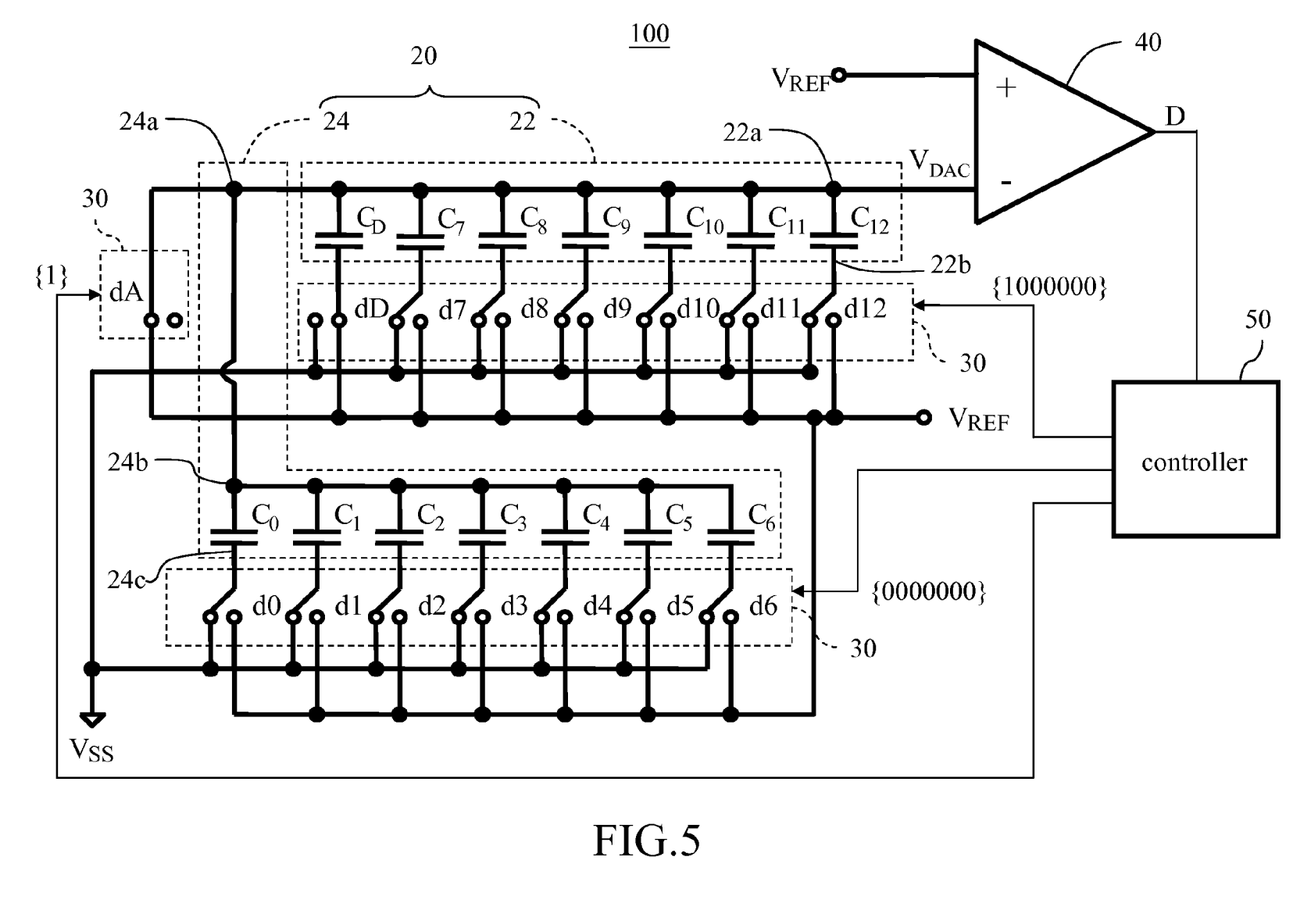
FIG. 5 is another schematic diagram of a successive approximation ADC.

The successive approximation ADC is not limited by the above embodiments. In FIG. 5, another schematic diagram of a successive approximation ADC 100 is shown. The successive approximation ADC 100 in this embodiment is basically similar to the successive approximation ADC 10 in the above embodiment. The main difference between the successive approximation ADCs 10 and 100 is that the attenuation capacitor $C_{cal}$ is removed from the successive approximation ADC 100. In other words, the terminal 24a is directly connected to the terminal 24b in the successive approximation ADC 100. Nevertheless, the operation of the successive approximation ADC 100 can refer to the embodiments in FIG. 2A to FIG. 4 for acquiring the error estimation of the capacitance weights, and will not be repeatedly described hereinafter.

In this embodiment, the weights of the capacitors $C_6$ to $C_0$ follows the smallest one of the capacitors $C_{12}$ to $C_7$. For example, the capacitance weights of the capacitors $C_6$ to $C_0$ follow the weight of the capacitor $C_7$. For instance, the capacitance weights of the capacitance values of the capacitors $C_{12}$ to $C_7$ and the auxiliary capacitor $C_D$ are $2^5$, $2^4$, $2^3$, $2^2$, $2^1$, 1 and <1 respectively, the capacitance weights of the capacitance values of the capacitors $C_6$ to $C_0$ are $2^{-1}$, $2^{-2}$, $2^{-3}$, $2^{-4}$, $2^{-5}$, $2^{-6}$ and $2^{-7}$ respectively.

Figure 6:
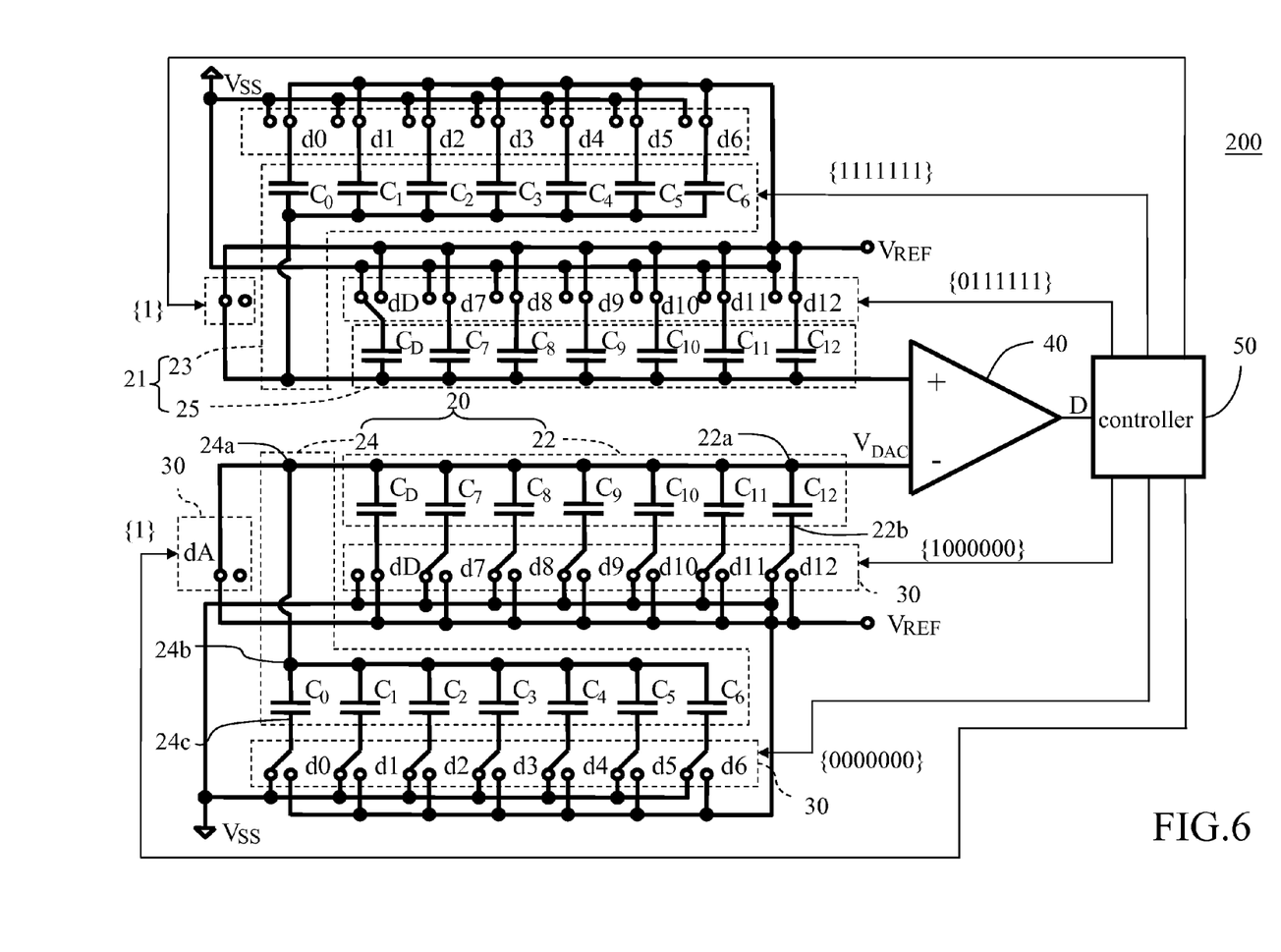
FIG. 6 is still another schematic diagram of a successive approximation ADC.

FIG. 6 illustrates another schematic diagram of a successive approximation ADC 200. The successive approximation ADC 200 in this embodiment is basically similar to the successive approximation ADCs 10 and 100. The main difference between the successive approximation ADC 100 and the successive approximation ADC 200 is that the successive approximation ADC 200 further includes a capacitor set 21. The capacitor set 21 has a primary capacitor array 23 and a secondary capacitor array 25. The primary capacitor array 23 also includes the capacitors $C_{12}$ to $C_7$ and an auxiliary capacitor $C_D$, and the secondary capacitor array 25 also includes the capacitors $C_6$ to $C_0$. The structure of the capacitor set 21 is the same as that of a capacitor set 20 in FIG. 6.

The first terminals of the capacitors $C_{12}$ to $C_7$ in the capacitor set 20 are connected to the second input terminal (the negative input terminal) of the comparator 40, and the first terminals of the capacitors $C_{12}$ to $C_7$ in the capacitor set 21 are connected to the first terminal (the positive terminal) of the comparator 40. Thus, the successive approximation ADC 200 is a fully-differential design, and the output of the comparator 40 is a fully-differential bit-cycling signal.

Furthermore, the capacitors $C_{12}$ to $C_7$ and the auxiliary capacitor $C_D$ in the capacitor set 20 respectively cooperate with the corresponding capacitors$_{12}$ to $C_7$ and the auxiliary capacitor $C_D$ in the capacitor set 21 to form differential capacitor pairs. For example, the capacitor $C_{12}$ in the capacitor set 20 is connected to the capacitor $C_{12}$ in the capacitor set 21 to form a differential capacitor pair, the capacitor $C_{11}$ in the capacitor set 20 is connected to the capacitor $C_{11}$ in the capacitor set 21 to form another differential capacitor pair, and the rest may be deduced by analogy. The capacitors $C_6$ to $C_0$ in the capacitor set 20 respectively cooperate with the corresponding capacitors $C_6$ to $C_0$ in the capacitor set 21 to form differential capacitor pairs. For example, the capacitor $C_6$ in the capacitor set 20 cooperates with the capacitor $C_6$ in the capacitor set 21 to form a differential capacitor pair, the capacitor $C_5$ in the capacitor set 20 cooperates with the capacitor $C_5$ in the capacitor set 21 to form another differential capacitor pair, and the rest may be deduced by analogy.

Moreover, the step of pre-charging in this embodiment causes that the voltage between the two input terminals of the comparator converges to $V_{REF}/2$ after the bit-cycling operation.

In this way, when the successive approximation ADC 200 in this embodiment acquires the digital estimation values of the capacitance weights of capacitors, the fully-differential manner is used for estimating the weight of each differential capacitor pair in the capacitor sets 20 and 21. In addition, the successive approximation ADC 200 can further include the attenuation capacitor $C_{cal}$ shown in FIG. 2A, and the operation of the successive approximation ADC 200 refers to the embodiments in FIG. 2A to FIG. 5 for acquiring the error estimation of the capacitance weights, and is not repeatedly described hereinafter.

As set forth above, this disclosure can estimate the capacitance weights and capacitance weight errors of the capacitors, and calibrate the successive approximation ADC and perform the analog to digital conversion by using the same circuit structure. In addition, the capacitance weight errors of the capacitors can directly be stored in digital form and then be used for calibrating the result of the analog to digital conversion. It is not necessary for the disclosure to using extra DACs, thereby reducing the capacitance weight errors caused in the digital to analog conversion. Therefore, the successive approximation ADC in the disclosure may have a higher accurate result of the analog to digital conversion than the conventional hardware structure.

What is claimed is:

1. A method for estimating capacitance weight errors of a digital to analog converter (DAC) in a successive approximation analog to digital converter (ADC) including a comparator, a capacitor set and a switch set, the capacitor set including a primary capacitor array and a secondary capacitor array, the primary capacitor array including a plurality of first capacitors and an auxiliary capacitor, and the secondary capacitor array including a low-weighted capacitor array having a plurality of known second capacitors, the method comprising:

(A) pre-charging at least one of the first and auxiliary capacitors in the primary capacitor array by a first reference voltage, wherein the step (A) comprises:

controlling the first terminals of the first and auxiliary capacitors in the primary capacitor array to be supplied with the first reference voltage;

transmitting a control signal to the switch set for setting one of the first and auxiliary capacitors to be a capacitor under test (CUT) which is supplied with the first reference voltage through the switch set; and controlling a part of the first and auxiliary capacitors except the CUT in the primary capacitor array to be supplied with a second reference voltage;

(B) redistributing electric charges to the first and auxiliary capacitors in the primary capacitor array and to the second capacitors in the secondary capacitor array, by using the at least charged one of the first and auxiliary capacitors, wherein the step (B) comprises:

controlling the first terminals of the first capacitors and the auxiliary capacitor in the primary capacitor array to be floating;

controlling the CUT to be supplied with the second reference voltage through the switch set; and controlling the part of the first and auxiliary capacitors except the CUT in the primary capacitor array to be supplied with the first reference voltage through the switch set; and (C) using an output of an output terminal of the comparator to generate bit-cycling signals for controlling the second capacitors in the secondary capacitor array and making voltages of the first and auxiliary capacitors in the primary capacitor array successively approximate to the first reference voltage, so as to respectively acquire a digital estimation value of capacitance weight, and to calculate a capacitance weight error estimation value of corresponding one of the first and auxiliary capacitors according to the acquired digital estimation value of the capacitance weight, wherein the digital estimation value of the capacitance weight is acquired by the following function:

$$c_{Mprc} - c_{Mset} = \frac{c_{cal}}{(c_{cal} + c_{Stotal})} c_{cyc} = \frac{c_{cal}}{(c_{cal} + c_{Stotal})} dc_x c_0 = W_{sub} \times dc_x \times c_0$$

wherein $dc_x$ represents the digital estimation value, $c_{Mprc}$ represents a sum of the capacitance values of the primary capacitor array supplied with the first reference voltage in step (A), $c_{Mset}$ represents a sum of the capacitance values of the primary capacitor array supplied with the first reference voltage in step (B), $c_{cal}$ represents the capacitance value of an attenuation capacitor, $C_{Stotal}$ represents a sum of the capacitance values of the second capacitors in the secondary capacitor array, $c_{cyc}$ represents a sum of the capacitance values of the second capacitors supplied with the first reference voltage through the switch set, $c_0$ represents a minimum capacitance value in the secondary capacitor array, and $W_{sub}$ represents the capacitance weight of the secondary capacitor array;

wherein the secondary capacitor array further comprises the attenuation capacitor connected with the low-weighted capacitor array in series, a first terminal of the attenuation capacitor is connected to first terminals of the first and auxiliary capacitors, a second terminal of the attenuation capacitor is connected to first terminals of the second capacitors, the first terminals of the first, auxiliary and attenuation capacitors are connected to a first input terminal of the comparator, a second input terminal of the comparator is supplied with the first reference voltage, the switch set is coupled to the second terminals of the first, second and auxiliary capacitors for controlling the first, second and auxiliary capacitors to be supplied with the first reference voltage or with the second reference voltage, a capacitance weight of the attenuation capacitor is 1, capacitance values of the first and auxiliary capacitors are the same as capacitance values of the second capacitors, capacitance weights of the second capacitors are binary-weighted, and the capacitance value of the auxiliary capacitor is smaller than an equivalent capacitance value of the secondary capacitor array.

2. The method for estimating capacitance weight errors of the DAC in the successive approximation ADC according to claim 1, further comprising:
(D) determining whether the capacitance weight error estimation values of the first and auxiliary capacitors in the primary capacitor array are calculated or not; and
if the capacitance weight error estimation values of the first and auxiliary capacitors in the primary capacitor array are not calculated, returning to the step (A) and repeating the steps (A), (B) and (C) until the capacitance weight error estimation values of the first and auxiliary capacitors in the primary capacitor array are calculated.

3. The method for estimating capacitance weight errors of the DAC in the successive approximation ADC according to claim 1, wherein first terminals of the first and auxiliary capacitors in the primary capacitor array are connected to first terminals of the second capacitors in the secondary capacitor array, the first terminals of the first capacitors are connected to a first input terminal of the comparator, a second input terminal of the comparator is supplied with the first reference voltage, and the switch set is coupled to second terminals of all of the first and second capacitors for controlling the first and second capacitors to be supplied with the first reference voltage or with the second reference voltage, capacitance weights of the second capacitors are successive to a minimum capacitance weight among capacitance weights of the first capacitors, and the capacitance weights of the first and second capacitors are binary-weighted.

4. The method for estimating capacitance weight errors of the DAC in the successive approximation ADC according to claim 1, wherein the success approximation ADC further comprises another capacitor set which is the same as the capacitor set, first terminals of the first capacitors in the capacitor set are connected to a first input terminal of the comparator, first terminals of first capacitors in the another capacitor set are connected to a second input terminal of the comparator, and an output terminal of the comparator outputs bit-cycling signals which are fully-differential.

5. The method for estimating capacitance weight errors of the DAC in the successive approximation ADC according to claim 4, wherein when the digital estimation values of the capacitance weights are acquired, a fully-differential operation is performed for estimating weights of differential capacitor pairs in the capacitor set and the another capacitor set, and each of the differential capacitor pairs comprises one of the first, auxiliary and second capacitors in the capacitor set and corresponding one of the first capacitors, an auxiliary capacitor and second capacitors in the another capacitor set.

6. A successive approximation ADC, comprising:
a comparator having a first input terminal, a second input terminal and an output terminal, wherein the first input terminal is supplied with a first reference voltage;
a capacitor set comprising a primary capacitor array and a secondary capacitor array, the primary capacitor array comprising a plurality of first capacitors and an auxiliary capacitor, each of the first and auxiliary capacitors having a first terminal and a second terminal, the secondary capacitor array comprising a plurality of second capacitors, each of the second capacitors having a first terminal and a second terminal, the first terminals of the first capacitors being electrically connected to the second input terminal of the comparator, the first terminal of the auxiliary capacitor being electrically connected to the second input terminal of the comparator, and the first terminals of the second capacitors being electrically connected to the second input terminal of the comparator, wherein a capacitance weight of one first capacitor with a minimum capacitance value in the first capacitors is 1, a capacitance weight of the auxiliary capacitor is smaller than 1, and capacitance weights of the second capacitors are binary-weighted;
a switch set comprising a plurality of switches which are respectively connected with the second terminals of the first and auxiliary capacitors in the primary capacitor array and the second terminals of the second capacitors, each of the switches respectively controlling the second terminals of the first, second and auxiliary capacitors to be supplied with the first reference voltage or a second reference voltage; and
a controller, for controlling the switch set, and performing the following steps:
(A) pre-charging at least one of the first capacitors in the primary capacitor array by the first reference voltage, wherein the step (A) comprises:
controlling the first terminals of the first capacitors and the first terminal of the auxiliary capacitor to be supplied with the first reference voltage;
transmitting a control signal to the switch set for making either one first capacitor or the auxiliary capacitor to be a CUT and be supplied with the first reference voltage through the switch set; and
controlling the first capacitors and the auxiliary capacitor except the CUT in the primary capacitor array to be supplied with the second reference voltage through the switch set;
(B) by using at least one charged capacitor, redistributing electric charges to the first and auxiliary capacitors in the primary capacitor array and to the second capacitors in the secondary capacitor array, wherein the step (B) comprises:
controlling the first terminals of the first and auxiliary capacitors in the primary capacitor array to be floating;
controlling the CUT to be supplied with the second reference voltage through the switch set; and
controlling the first and auxiliary capacitors except the CUT in the primary capacitor array to be supplied with the first reference voltage through the switch set; and
(C) controlling the second capacitors in the secondary capacitor array according to bit-cycling signals outputted by an output of the output terminal of the comparator, and making a voltage at the first terminals of the first capacitors in the primary capacitor array successively approximate to the first reference voltage, so as to acquire a digital estimation value of the capacitance weight, and to calculate a capacitance weight error estimation value of corresponding one of the first and auxiliary capacitors according to the acquired digital estimation value of the capacitance weight, wherein the digital estimation value is expressed as:

$$c_{Mprc} - c_{Mset} = \frac{c_{cal}}{(c_{cal} + c_{Stotal})}c_{cyc} = \frac{c_{cal}}{(c_{cal} + c_{Stotal})}dc_x c_0 = W_{sub} \times dc_x \times c_0$$

wherein $dc_x$ represents the digital estimation value, $c_{Mprc}$ represents a sum of the capacitance values in the primary capacitor array supplied with the first reference voltage in step (A), $c_{Mset}$ represents a sum of capacitance values of the first capacitors and the auxiliary capacitor in the primary capacitor array supplied with the first reference voltage in step (B), $c_{cal}$ represents a capacitance value of an attenuation capacitor, $c_{Stotal}$ represents a sum of capacitance values of the second capacitors in the secondary capacitor array, $c_{cyc}$ represents a sum of the capacitance values of the second capacitors which are supplied with the first reference voltage through the switch set, $c_0$ represents the minimum one of the capacitance values of the second capacitors in the secondary capacitor array, and $W_{sub}$ represents the capacitance weight of the secondary capacitor array.

7. The successive approximation ADC according to claim 6, wherein the controller further performs the following step:
(D) repeating the steps (A), (B) and (C) until the controller obtains the capacitance weight estimation values of the first and auxiliary capacitors in the primary capacitor array.

8. The successive approximation ADC according to claim 6, wherein the capacitance weights of the first capacitors are binary-weighted.

9. The successive approximation ADC according to claim 6, wherein the capacitance weights of the second capacitors are successive to a minimum capacitance weight in the capacitance weights of the first capacitors.

10. The successive approximation ADC according to claim 6, wherein the secondary capacitor array further comprises the attenuation capacitor, the second capacitors are electrically connected to the second input terminal of the comparator through the attenuation capacitor, the attenuation capacitor has a first terminal and a second terminal, the first terminal of the attenuation capacitor is electrically connected to the second input terminal of the comparator, the second terminal of the attenuation capacitor is electrically connected to the first terminal of each second capacitor, and a capacitance weight of the attenuation capacitor is 1.

* * * * *